(12) United States Patent
Efferenn et al.

(10) Patent No.: US 6,964,912 B2
(45) Date of Patent: Nov. 15, 2005

(54) METHOD FOR FABRICATING A SEMICONDUCTOR STRUCTURE

(75) Inventors: Dirk Efferenn, Dresden (DE); Hans-Peter Moll, Dresden (DE)

(73) Assignee: Infineon Technologies AG, Munich (DE)

( * ) Notice: Subject to any disclaimer, the term of this patent is extended or adjusted under 35 U.S.C. 154(b) by 119 days.

(21) Appl. No.: 10/721,752

(22) Filed: Nov. 26, 2003

(65) Prior Publication Data

US 2004/0157390 A1 Aug. 12, 2004

(30) Foreign Application Priority Data

Nov. 28, 2002 (DE) ......................................... 102 55 686

(51) Int. Cl.[7] .............................................. H01L 21/76
(52) U.S. Cl. ...................................... 438/424; 438/700
(58) Field of Search ................................. 438/424, 700

(56) References Cited

U.S. PATENT DOCUMENTS

| | | | |
|---|---|---|---|
| 6,873,000 B2 * | 3/2005 | Goldbach et al. ........... | 257/301 |
| 2003/0045051 A1 * | 3/2003 | Pohl et al. .................. | 438/243 |
| 2003/0072198 A1 | 4/2003 | Goldbach et al. | |

FOREIGN PATENT DOCUMENTS

| | | |
|---|---|---|
| DE | 101 39 430 | 3/2003 |
| DE | 101 39 431 | 3/2003 |
| DE | 101 49 199 | 4/2003 |

* cited by examiner

Primary Examiner—David S. Blum
(74) Attorney, Agent, or Firm—Morrison & Foerster LLP

(57) ABSTRACT

A method for fabricating a semiconductor structure includes providing a semiconductor substrate, providing a plurality of trenches in the semiconductor substrate using a first hard mask, and causing the hard mask to recede by a predetermined distance with respect to the trench wall at the top side of the semiconductor substrate for forming a first hard mask that has been caused to recede. An isolation trench structure is provided in the semiconductor substrate using a second hard mask, the isolation trench structure subdividing the first first hard mask that has been caused to recede along rows into strip sections and the strip sections of adjacent rows being arranged offset with respect to one another. The receding process results in a reduction of an overlap region between two strip sections of adjacent rows in comparison with an overlap region which would be present without the receding process. The second hard mask is removed and the isolation trench structure is filled and planarized with a filling material using the first hard mask subdivided into the strip sections.

7 Claims, 7 Drawing Sheets

METHOD FOR FABRICATING A SEMICONDUCTOR STRUCTURE

CLAIM FOR PRIORITY

This application claims the benefit of priority to German Application No. 102 55 686.5, which was filed in the German language on Nov. 28, 2002.

TECHNICAL FIELD OF THE INVENTION

The present invention relates to a method for fabricating a semiconductor structure.

BACKGROUND OF THE INVENTION

Although applicable, in principle, to any desired integrated circuits, the present invention and also the problem area on which it is based are explained with regard to memory cell semiconductor structures with trench capacitors in silicon technology.

FIG. 2 shows conventional memory cell semiconductor structures with trench capacitors in silicon technology, which is also referred to as an MINT cell layout.

In FIG. 2, reference symbols G1 to G8 designate trench capacitors which are arranged offset relative to one another in pairs in rows and columns. Lying between the trench capacitors G1 to G8 are active regions AA1 to AA7 or shallow trench isolation structures STI filled with an insulation material, which enclose the active regions AA1 to AA7 in insular fashion.

Accommodated in the active regions AA1 to AA7 are respective selection transistors (not shown) for the trench capacitors G1 to G8. In this case, the selection transistors of in each case two trench capacitors, for example G4 and G5 have a common bit line terminal lying approximately in the center of the active region, in this case AA4. Situated between the bit line terminal and the respective trench capacitor is a gate line terminal connected to a respective word line. In the case of the present layout, the bit lines (not shown) run in the row direction and the word lines (not shown) run in the column direction. The cells are configured symmetrically with respect to the common bit line terminal.

Filling the isolation trench structure with the insulating filling material, which is generally composed of silicon oxide, has proved to be problematic in case of such an arrangement scheme for a memory cell semiconductor structure with trench capacitors. This is because the structures have a high aspect ratio in particular in the isolation trenches between the adjacent rows, which generally has the effect that shrink holes form in the insulating filling material. It is primarily at the location at which two adjacent active regions overlap that the aspect ratio of the STI trench to be filled is very high and the risk of shrink hole formation is thus the greatest.

Usually, the shrink hole formation can only be avoided by carrying out multiple deposition and wet-chemical etching-back of the insulating filling material.

The present invention provides an improved method for fabricating such a semiconductor structure which makes it possible to reduce the risk of shrink hole formation during filling of the isolation trenches.

Advantages of the fabrication method according to the invention are, in particular, that the aspect ratio can be relaxed in the critical overlap region and regions with a particularly critical aspect ratio are eliminated or can at least be greatly reduced in size. The risk of shrink hole formation during filling of the isolation trenches is reduced from the outset in this way.

The process results in reduction or elimination of an overlap region between two strip sections of adjacent rows in comparison with an overlap region which would be present without the receding process.

In accordance with one preferred embodiment, the trenches each have a trench capacitor with a corresponding filling, which is sunk with respect to the top side of the semiconductor substrate.

In accordance with a further preferred embodiment, the receding process is realized by an isotropic, preferably wet-chemical, etching process, as a result of which the thickness of the hard mask that has been caused to recede is reduced in comparison with the thickness of the hard mask. The aspect ratio can be configured even more favorably as a result.

In accordance with a further preferred embodiment, the first hard mask is composed of silicon nitride.

In accordance with a further preferred embodiment, the second hard mask is composed of silicon oxide.

In accordance with a further preferred embodiment, the filling material is composed of silicon oxide.

In accordance with a further preferred embodiment, the receding process results in complete elimination of an overlap region between two strip sections of adjacent rows.

BRIEF DESCRIPTION OF THE DRAWINGS

Exemplary embodiments of the invention are illustrated in the drawings and explained in more detail in the description given below.

In FIGS. 1a–f, identical reference symbols designate identical or functional identity constituent parts.

DETAILED DESCRIPTION OF THE INVENTION

The embodiment illustrated in FIGS. 1a–f relates to the known arrangement scheme explained above in accordance with FIG. 2.

Figure 1A:
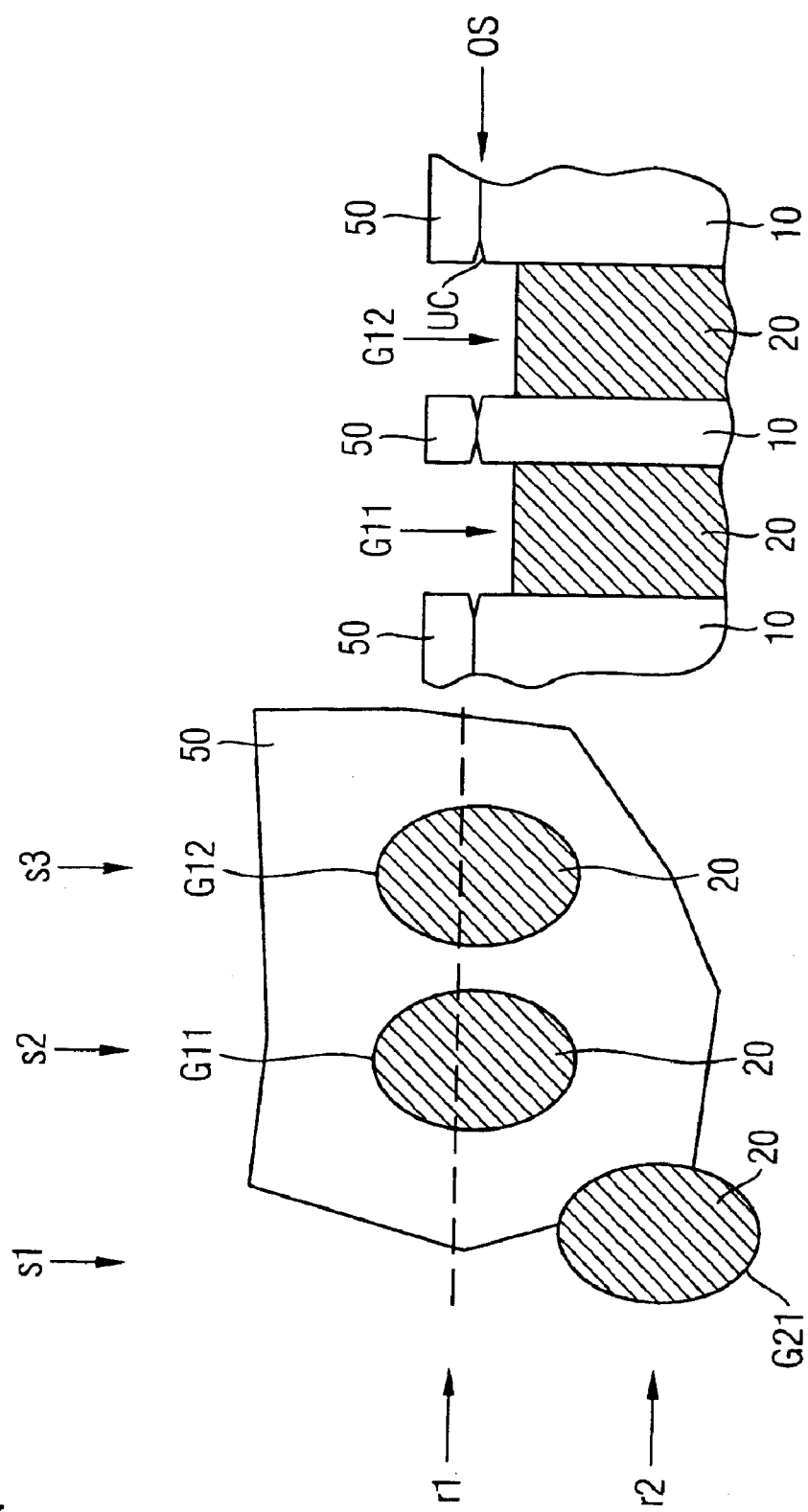
FIGS. 1a–f show successive method stages of a method for fabricating a semiconductor structure as an embodiment of the present invention.
Figure 2:
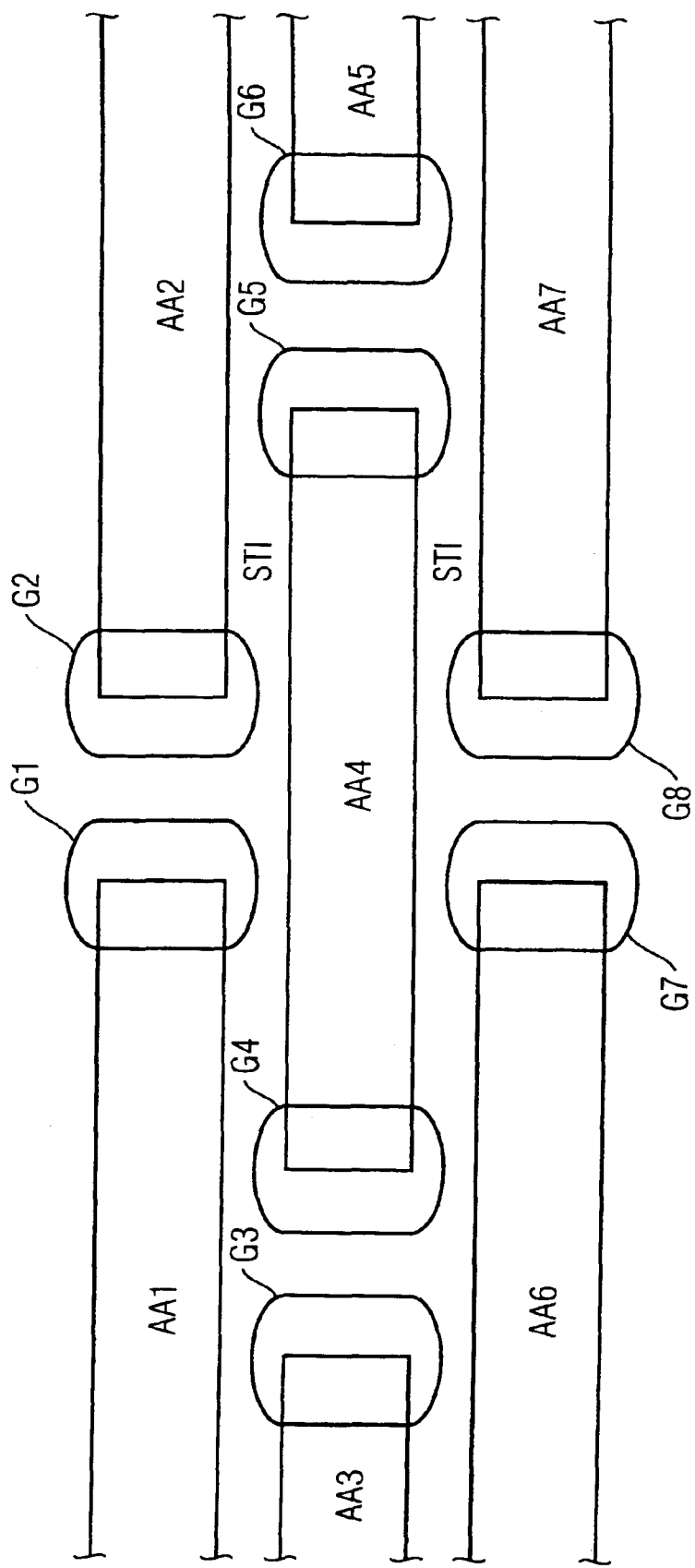
FIG. 2 shows conventional memory cell semiconductor structures with trench capacitors in silicon technology.

In FIG. 1a, r1, r2 designate adjacent rows and s1, s2 and s3 designate adjacent columns of the memory cell arrangement, the trenches G11 and G12 being arranged in the row r1, the trenches serving for trench capacitors which have no selection transistors with a common accompanying terminal. The trench G21 is provided in offset fashion in the row r2.

The right-hand part of FIGS. 1a–f in each case comprises a sectional illustration along the broken line in the left-hand part.

The sectional illustration of FIG. 1a reveals that, in the process state considered, a mask 50 made of silicon nitride is provided on the semiconductor substrate 10 with the trenches G11, G12, G21, which mask has served for etching the trenches G11, G12, G21 by means of a corresponding silicon etching process.

As can further be seen from FIG. 1a, a filling made of polysilicon 20 is provided in the upper part of the trenches G11, G12, G21, said filling being sunk with respect to the top side OS of the semiconductor substrate 10. Said filling 20 is composed of polysilicon and is a part of the capacitor structure of the trench capacitor situated in the trenches, namely a buried connection strip for the inner capacitor plate which, in a later process step, is connected to the associated selection transistor in the active region through a corresponding diffusion region.

Finally, UC in FIG. 1a designates an undercut region between the semiconductor substrate 10 and the hard mask 50 made of silicon nitride, where pad oxide (not shown) situated there has been undercut during the formation of the capacitor structure.

Figure 1B:
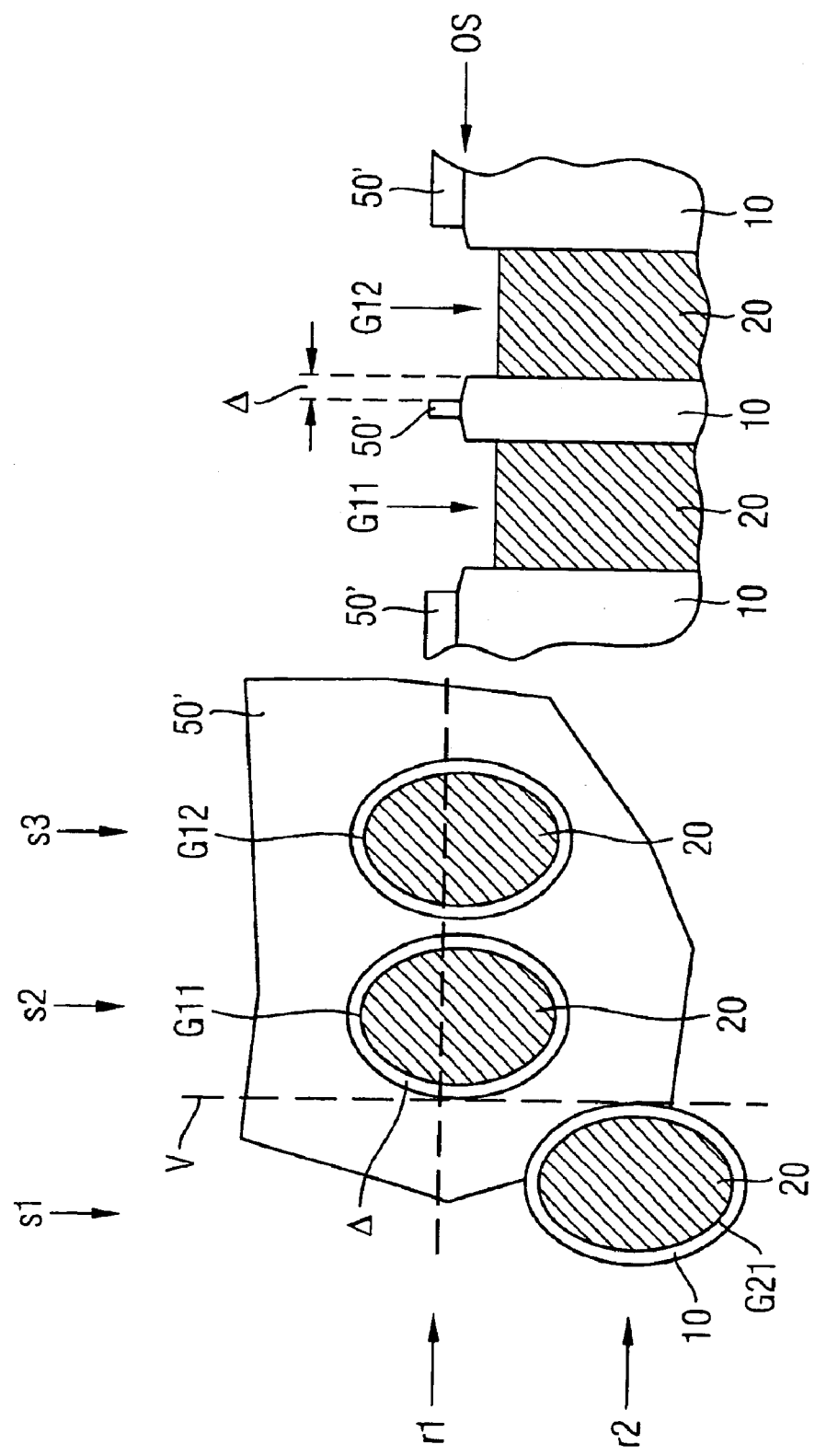

In accordance with FIG. 1b, in a subsequent process step, a selective wet-chemical etching-back of the silicon nitride of the hard mask 50 is effected for the purpose of forming a hard mask 50' that has been caused to recede with respect to the trench wall and whose thickness has been thinned. In this embodiment, the receding distance $\Delta$ is 40 nm to 50 nm, and the thickness in this case decreases from 140 nm to 90 nm to 100 nm. This etching-back may expediently be carried out in hot phosphoric acid.

Figure 1C:
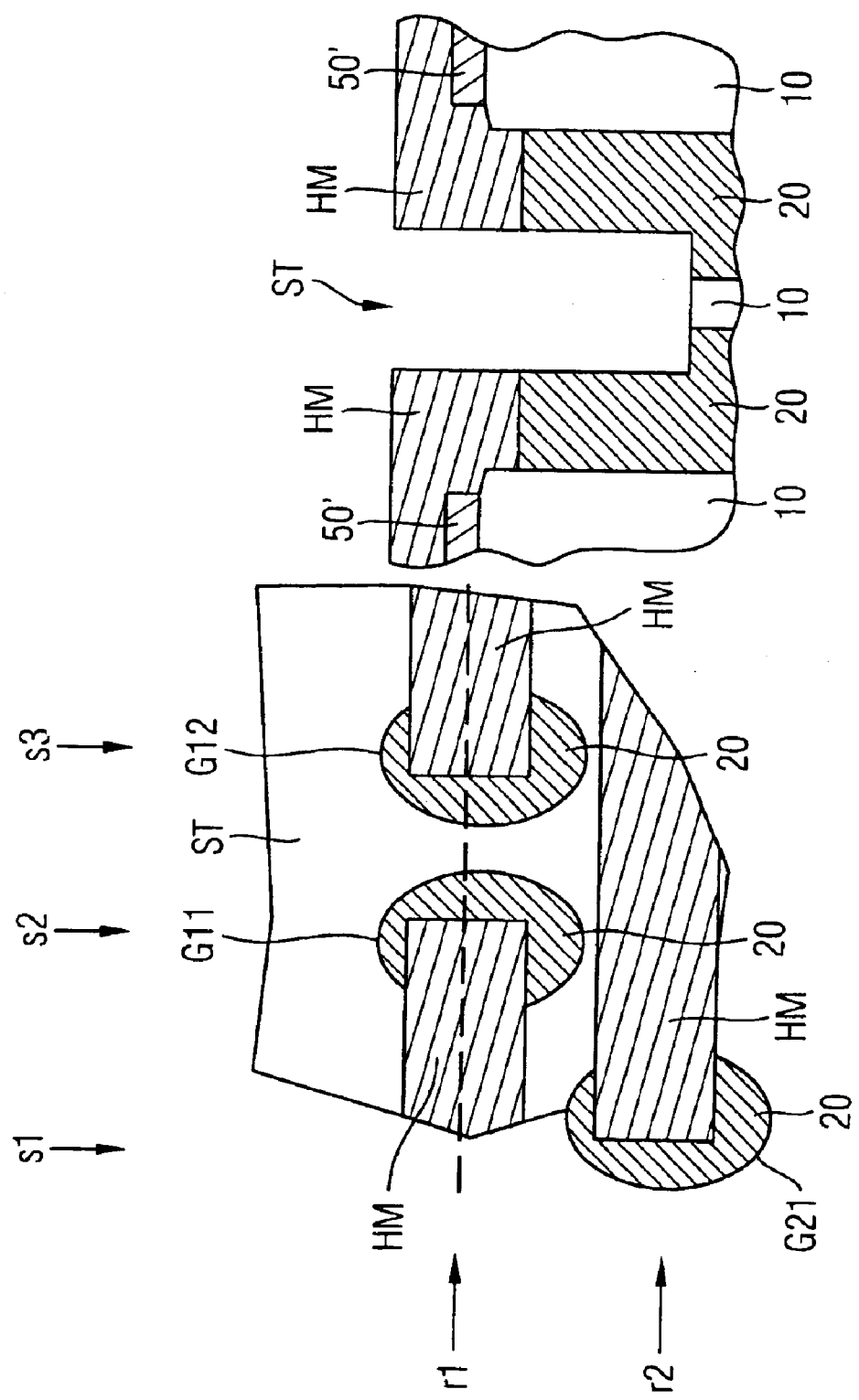

In a subsequent process step illustrated in FIG. 1c, a hard mask HM made of silicon oxide is then applied and patterned lithographically on the resultant structure. Said hard mask HM serves for defining the later isolation trench structure ST, which is produced by means of a silicon etchant. The silicon semiconductor substrate 10 that is not etched in this case (cf. FIG. 2) later forms the so-called active regions.

Figure 1D:
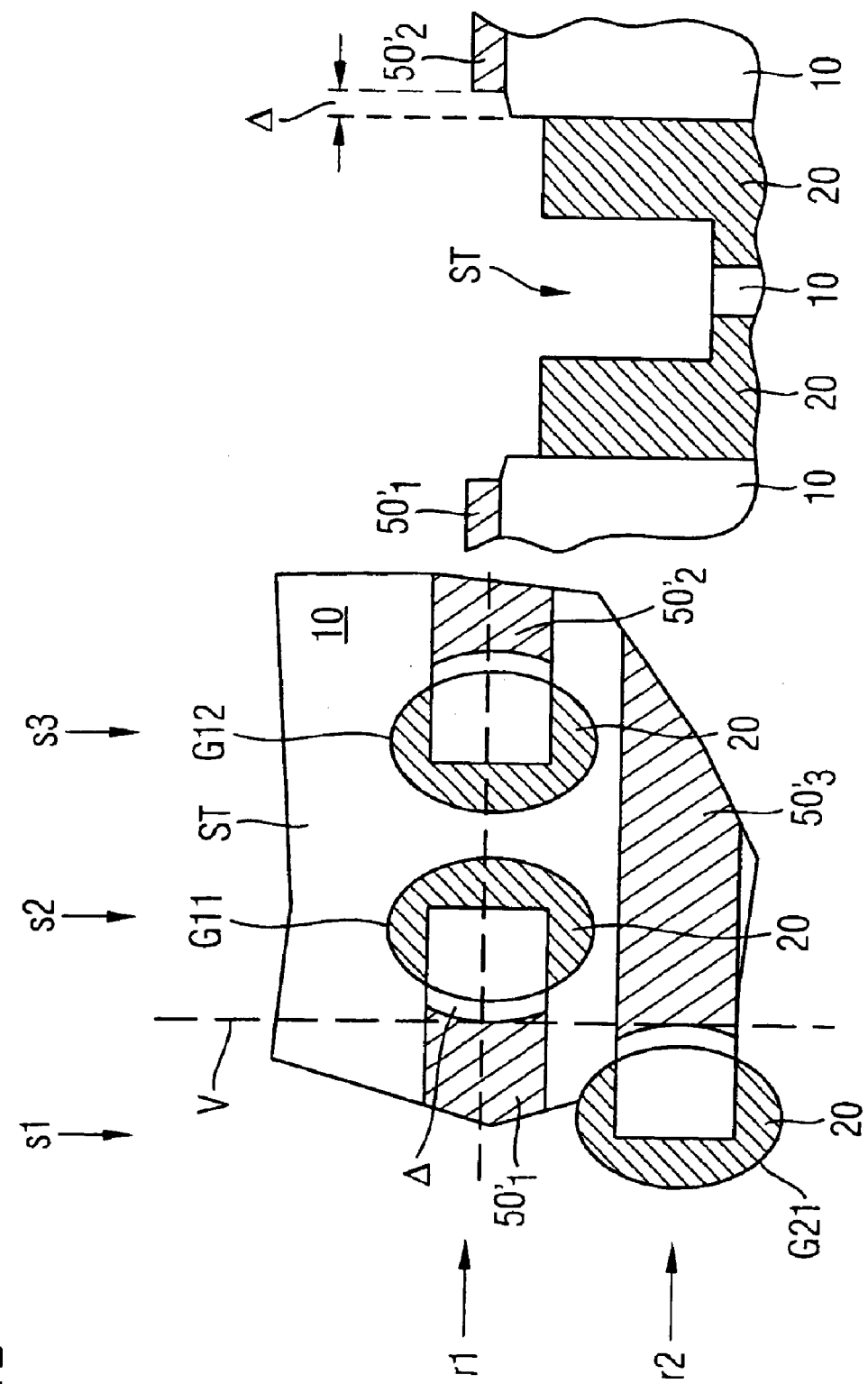

As can be seen from FIG. 1d, the isolation trench structure ST in the semiconductor substrate 10 subdivides the hard mask 50' that has been caused to recede along the rows r1, r2 into strip sections $50_1'$, $50_2'$ in the row r1 and $50_3'$ in the row r2, the strip sections of adjacent rows being arranged offset with respect to one another, here for example $50_1'$ and $50_3'$. The vertical connecting line V in FIG. 1d reveals that virtually no overlap of the strip sections $50_1'$ and $50_3'$ is present as a result of the provision of the receding region $\Delta$, as a result of which the aspect ratio at this critical location is significantly relaxed.

Figure 1E:
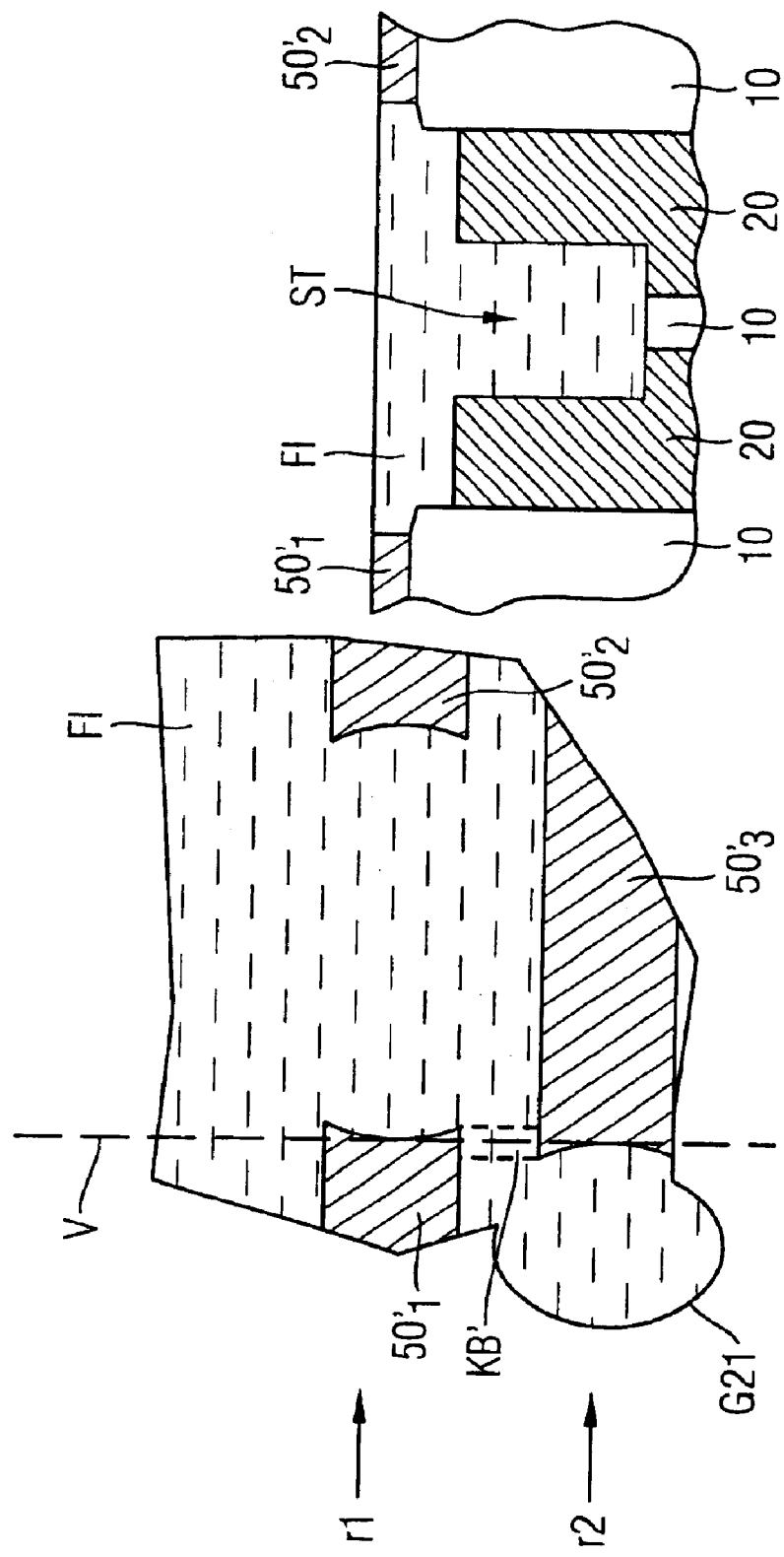

In a concluding process step in accordance with FIG. 1e, the isolation trench structure ST is then filled and planarized by means of silicon oxide as insulating filling material FI, for example by means of a high density plasma process, which can be realized without shrink hole formation on account of the reduced aspect ratio in the overlap region KB' that has been reduced in size. Repeated deposition and etching-back of the insulating filling material FI made of silicon oxide is thus unnecessary.

Figure 1F:
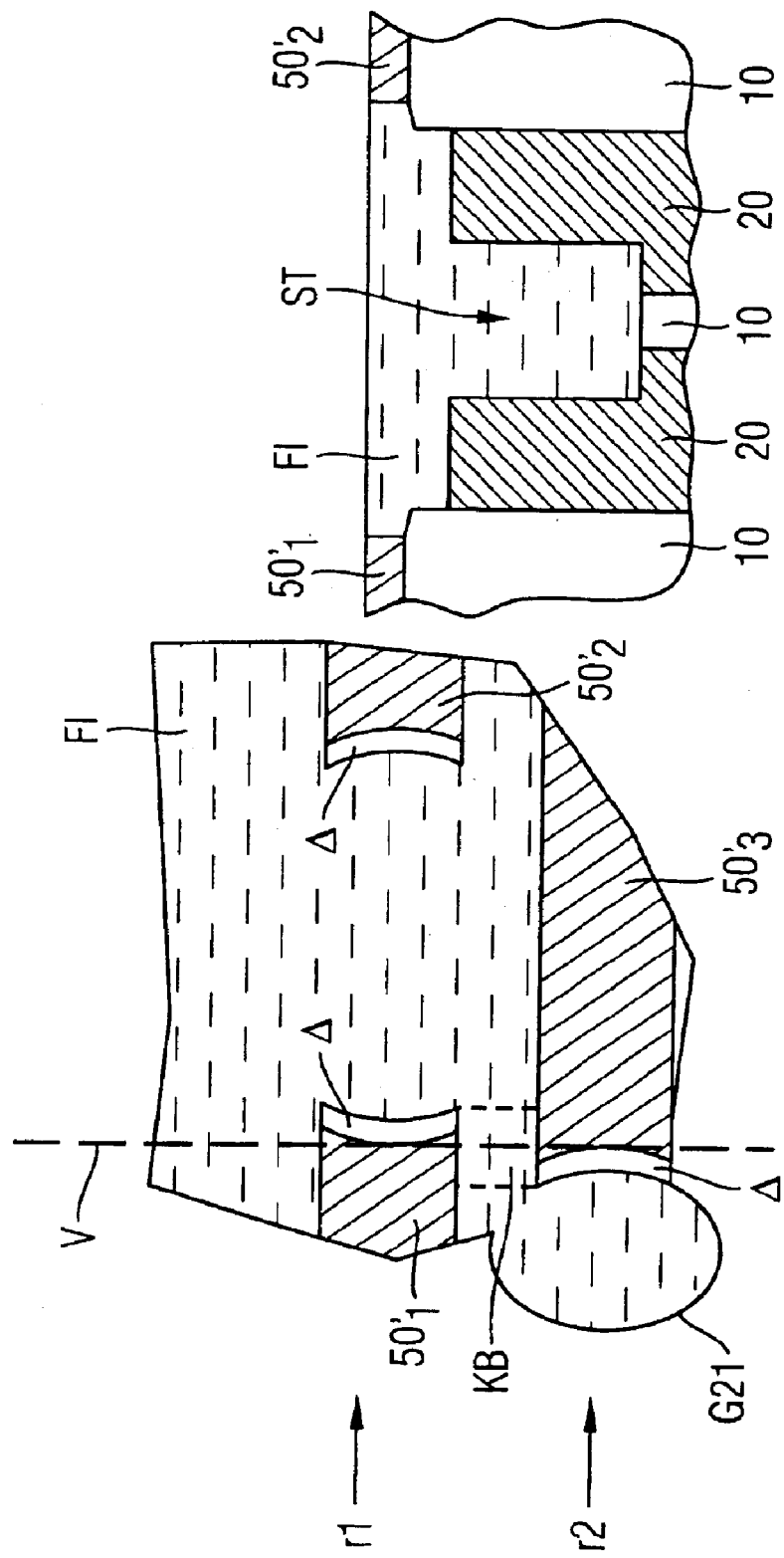

FIGS. 1e and 1f show, in a comparison, the critical overlap region KB' and KB, respectively, in the case of causing the hard mask 50 made of silicon nitride to recede and in the case where no receding process is carried out. It can clearly be discerned that the overlap region KB' in the case of the receding process is significantly smaller than the overlap region KB in the case where this step is absent.

In the case of known structures, it was possible to relax the aspect ratio in the critical overlap region KB from 4.2 to 2.9 by means of the procedure according to the invention.

Although the present invention has been described above on the basis of a preferred exemplary embodiment, it is not restricted thereto, but rather can be modified in diverse ways.

In particular, the selection of the mask and substrate materials are exemplary of the arrangement thereof are only by way of example and can be varied in many different ways.

Although in the above embodiment, the process of causing the hard mask 50 made of silicon nitride to recede still leaves a small overlap region KB', this receding process could be carried out in such a way that the overlap region is completely removed.

What is claimed is:

1. A method for fabricating a semiconductor structure, comprising:

providing a semiconductor substrate;

providing a plurality of trenches in the semiconductor substrate using a first hard mask, which trenches are arranged offset with respect to one another in rows and columns;

causing the hard mask to recede by a predetermined distance with respect to a trench wall at a top side of the semiconductor substrate for forming a first hard mask that has been caused to recede;

providing an isolation trench structure in the semiconductor substrate using a second hard mask, the isolation trench structure subdividing the first hard mask that has been caused to recede along the rows into strip sections and the strip sections of adjacent rows being arranged offset with respect to one another;

the receding process resulting in a reduction of an overlap region between two strip sections of adjacent rows in comparison with an overlap region which would be present without the receding process;

removing the second hard mask; and filling and planarizing the isolation trench structure with a filling material using the first hard mask subdivided into the strip sections.

2. The method according to claim 1, wherein the trenches each have a trench capacitor with a corresponding filling, which is sunk with respect to the top side of the semiconductor substrate.

3. The method according to claim 1, wherein the receding process is realized by an isotropic, wet-chemical, etching process, as a result of which a thickness of the first hard mask that has been caused to recede is reduced in comparison with a thickness of the hard mask.

4. The method according to claim 1, wherein the first hard mask is composed of silicon nitride.

5. The method according to claim 1, wherein the second hard mask is composed of silicon oxide.

6. The method according to claim 1, wherein the filling material is composed of silicon oxide.

7. The method according to claim 1, wherein the receding process results in elimination of an overlap region between two strip sections of adjacent rows.

\* \* \* \* \*